United States Patent
Kim et al.

(10) Patent No.: US 8,251,528 B2
(45) Date of Patent: Aug. 28, 2012

(54) WAVELENGTH CONVERSION PLATE AND LIGHT EMITTING DEVICE USING THE SAME

(75) Inventors: Jae Il Kim, Seoul (KR); Bae Kyun Kim, Gyunggi-do (KR); Dong Hyun Cho, Gyeongsangnam-do (KR); Kyoung Soon Park, Gyunggi-do (KR); In Hyung Lee, Seoul (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 633 days.

(21) Appl. No.: 12/397,115

(22) Filed: Mar. 3, 2009

(65) Prior Publication Data

US 2010/0053930 A1 Mar. 4, 2010

(30) Foreign Application Priority Data

Sep. 3, 2008 (KR) ........................ 10-2008-0086983

(51) Int. Cl.
*F21V 9/16* (2006.01)
*H01L 33/00* (2010.01)
(52) U.S. Cl. ........................................... 362/84; 257/98
(58) Field of Classification Search .................... 362/84; 257/98
See application file for complete search history.

(56) References Cited

U.S. PATENT DOCUMENTS

| | | | |
|---|---|---|---|
| 5,841,143 A * | 11/1998 | Tuma et al. | 250/458.1 |
| 6,501,091 B1 | 12/2002 | Bawendi et al. | |
| 2004/0150991 A1* | 8/2004 | Ouderkirk et al. | 362/231 |
| 2005/0135079 A1* | 6/2005 | Yin Chua et al. | 362/12 |
| 2007/0278607 A1* | 12/2007 | Gruhlke et al. | 257/458 |
| 2008/0303039 A1* | 12/2008 | Craford et al. | 257/89 |
| 2009/0272996 A1* | 11/2009 | Chakraborty | 257/98 |

OTHER PUBLICATIONS

Song, Jung-Hoon et al., "Large Enhancement of Fluorescence Efficiency from CdSe/ZnS Quantum Dots Induced by Resonant Coupling to Spatially Controlled Suface Plasmons," Nano Letters 2005, vol. 5, No. 8, pp. 1557-1561.

* cited by examiner

*Primary Examiner* — Diane Lee
*Assistant Examiner* — Sean Gramling
(74) *Attorney, Agent, or Firm* — McDermott Will & Emery LLP

(57) ABSTRACT

Provided is a wavelength conversion plate having excellent luminous efficiency of a wavelength-converted light. The wavelength conversion plate includes a dielectric layer with nano pattern, a metal layer formed inside the nano pattern, and a wavelength conversion layer formed on the metal layer and having quantum dot or phosphor which wavelength-converts an excitation light to generate a wavelength-converted light.

6 Claims, 3 Drawing Sheets

WAVELENGTH CONVERSION PLATE AND LIGHT EMITTING DEVICE USING THE SAME

CROSS-REFERENCE TO RELATED APPLICATIONS

This application claims the priority of Korean Patent Application No. 2008-0086983 filed on Sep. 3, 2008, in the Korean Intellectual Property Office, the disclosure of which is incorporated herein by reference.

BACKGROUND OF THE INVENTION

1. Field of the Invention

The present invention relates to a light emitting device and a method for manufacturing the same, and more particularly, to a wavelength conversion plate having excellent luminous efficiency of a wavelength-converted light, and a light emitting device using the same.

2. Description of the Related Art

Light emitting diode (LED) is characterized in that it emits light substantially identical to monochromatic light, while light from other light emitting devices such as an incandescent lamp has a wide light emission spectrum. Since LEDs have different energies according to their electron-hole recombination, they emit a red light, a green light, a blue light, a reddish yellow light, or a yellow light according to their characteristics.

Recently, there have been developed LEDs which can emit a white light or reproduce a plurality of colors. A white LED is manufactured by combination of several color LED chips, or combination of LED chips emitting specific color light and phosphors emitting specific color fluorescence. The currently commercialized white LED generally employs the latter method.

For example, a white LED package can be obtained by encapsulating a blue LED chip with a molding resin where a yellow phosphor is dispersed. If light having a wavelength of 460 nm is generated from the blue LED chip, the yellow phosphor absorbs the light and generates light having a wavelength of 545 nm. The two lights having the different wavelengths are mixed to output a white light. Therefore, a desired color light can be obtained by combining different kinds of phosphors.

Although the desired color can be obtained using the phosphors, the increase of the luminous efficiency is still required in view of the emission of the LED.

SUMMARY OF THE INVENTION

An aspect of the present invention provides a wavelength conversion plate having excellent luminous efficiency of a wavelength-converted light, and a light emitting device using the same.

According to an aspect of the present invention, there is provided a wavelength conversion plate including: a dielectric layer with nano pattern; a metal layer formed inside the nano pattern; and a wavelength conversion layer formed on the metal layer and comprising quantum dot or phosphor which wavelength-converts an excitation light to generate a wavelength-converted light.

The dielectric layer may include polymer resin or metal oxide. The polymer resin may include poly methyl methacrylate (PMMA), poly lauryl methacrylate (PLMA), or polystyrene. The metal oxide may include $SiO_2$ or $TiO_2$. The metal layer may include any one of Au, Ag, Al, Cu, Pt, Pd, and alloy thereof.

The quantum dot may include any one of Si nanocrystal, group II-VI compound semiconductor nanocrystal, group III-V compound semiconductor nanocrystal, group IV-VI compound semiconductor nanocrystal, and compounds thereof. The group II-VI compound semiconductor nanocrystal may include any one material selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The group III-V compound semiconductor nanocrystal may include any one material selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlP, GaAlNAs, GaAlPAs, GaInNP, GaInAs, GaInPAs, InAlNP, InAlNAs, and InAlPAs. The group IV-VI compound semiconductor nanocrystal may include SbTe.

According to another aspect of the present invention, there is provided a light emitting device including: a light emitting element; a groove part having a bottom surface where the light emitting element is mounted, and a side surface where a reflection part is formed; a support part supporting the groove part and having an electrode part electrically connected to the light emitting element; and a wavelength conversion plate disposed in at least one of the bottom surface and the side surface of the groove part, wherein the wavelength conversion plate includes: a dielectric layer with nano pattern; a metal layer formed inside the nano pattern; and a wavelength conversion layer formed on the metal layer and comprising quantum dot or phosphor which wavelength-converts an excitation light to generate a wavelength-converted light.

The light emitting device may further include a wavelength conversion unit disposed on the light emitting element and having quantum dot or phosphor which wavelength-converts light from the light emitting element. The wavelength conversion unit may be implemented with a plurality of layers. In this case, the wavelength conversion unit may be formed inside the groove part where the light emitting element is mounted.

When the wavelength conversion unit is implemented with a plurality of layers, at least two wavelength conversion units among the plurality of wavelength conversion units may include quantum dots or phosphors which convert the light emitted from the light emitting element into light having different wavelengths. Therefore, the light emitting element may emit an infrared light; the wavelength conversion plate may emit a blue light; a first wavelength conversion unit among the plurality of wavelength conversion units may emit a red light; and a second wavelength conversion unit different from the first wavelength conversion unit among the plurality of wavelength conversion units may emit a green light. In this way, the light emitting device can emit a white light.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
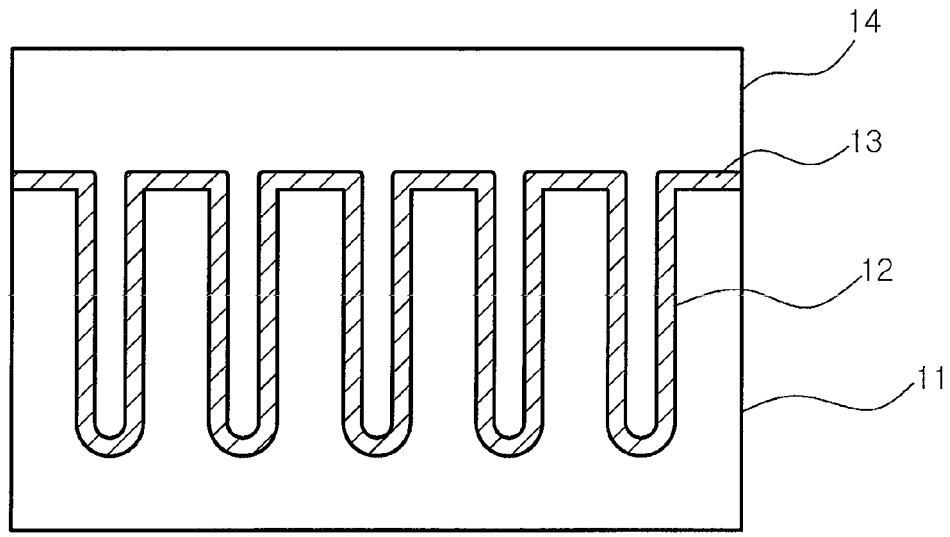
FIG. 1 illustrates a wavelength conversion plate according to an embodiment of the present invention.

Exemplary embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete and will fully convey the concept of the invention to those skilled in the art. In the drawings, the thicknesses of layers and regions are exaggerated for clarity.

FIG. 1 illustrates a wavelength conversion plate according to an embodiment of the present invention. The wavelength conversion plate 10 according to the embodiment of the present invention includes a dielectric layer 11 with nano pattern 12, a metal layer 13 formed inside the nano pattern 12, and a wavelength conversion layer 14 formed on the metal layer 13 and having quantum dot or phosphor wavelength-converting an excitation light to generate a wavelength-converted light.

Since the wavelength conversion plate 10 according to the embodiment of the present invention includes the dielectric layer 11 with the nano pattern 12 and the film-type metal layer 13 inside the nano pattern 12, that is, the patterned metal layer 13, incident light is amplified by surface plasmon phenomenon generated at an interface of the dielectric layer 11 and the metal layer 13.

The surface plasmon phenomenon is a collective charge density oscillation generated at the surface of the metal film, and a surface plasmon wave generated by the collective charge density oscillation is a surface electromagnetic wave which propagates along the interface of the metal and the dielectric. Such a phenomenon is generated in metals, such as gold (Au), silver (Ag), copper (Cu) or aluminum (Al), which are easily subject to emission of electrons by external stimulation and have a negative dielectric constant. Among those metals, silver (Ag) exhibiting the sharpest surface plasmon resonance (SPR) peak and gold (Au) exhibiting excellent surface stability are usually used.

The excitation of the surface Plasmon refers to the phenomenon that, when an electric field is applied from the outside to the interface of two media (i.e., metal and dielectric) having a different dielectric constant, surface charges are induced because of the discontinuity of vertical components of the electric field at the interface of the two media, and oscillation of those surface charges is exhibited as the surface plasmon wave.

Recently, the emission increase phenomenon derived from the surface plasmon phenomenon has been reported (Nano Letters, Vol. 5, No. 8, 1557-1561, 2005). According to this document, after patterning a polymer resin with constant sizes and intervals, an Ag layer was formed and a visible ray was irradiated thereon. In this case, the luminous efficiency was rapidly increased more than 10 times.

In the wavelength conversion plate 10 according to the embodiment of the present invention, if the quantum dot or phosphor included in the wavelength conversion layer 14 wavelength-converts the excitation light, the surface plasmon phenomenon is generated in the metal layer 13 and thus the wavelength-converted light is amplified.

The dielectric layer 11 may include a material having a different dielectric function from the metal layer 13 in order to generate the surface plasmon phenomenon in the metal layer 13. For example, the dielectric layer 11 may include polymer resin or metal oxide. The polymer resin used herein may be, but is not limited to, poly methyl methacrylate (PMMA), poly lauryl methacrylate (PLMA), or polystyrene. Also, the metal oxide used herein may be, but is not limited to, $SiO_2$ or $TiO_2$.

The nano pattern 12 is formed in the dielectric layer 11. Referring to FIG. 1, the nano pattern 12 may be formed in a cylindrical shape with a curved bottom. However, there is no special limitation in the shape of the nano pattern 12 only if the pattern itself is nano-sized.

As a method of forming the nano pattern 12 in the dielectric layer 11, an Anodic Aluminum Oxide template (AAO template) formed by oxidizing aluminum may be used. In the method using the AAO template, aluminum is used because of its unique characteristic in that aluminum forms a pore arrangement in itself in an oxidation process for forming aluminum oxide. In this case, the pore is several ten to several hundred nanometers in diameter and is several micrometers in length according to voltage and concentration of an acid solution in the aluminum oxidation process.

Therefore, if the dielectric layer is formed and its upper surface is etched using the AAO template, the nano pattern 12 is formed in the same shape as the pore formed in the AAO template.

The metal layer 13 patterned along the pattern inside the nano pattern 12 is formed on the dielectric layer 11. As described above, the metal layer 13 may be formed using a metal where the surface Plasmon phenomenon is easily generated, that is, a metal which is easily subject to emission of electrons by external stimulation and has a negative dielectric constant. The metal may include, but is not limited to, Au, Ag, Al, Cu, Pt, or Pd. There are many methods of forming the metal layer 13. As one method, the metal layer 13 may be formed by sputtering a metal onto the dielectric layer 11 where the nano pattern 12 is formed.

The wavelength conversion layer 14 is formed on the metal layer 13. The wavelength conversion layer 14 includes quantum dot or phosphor which wavelength-converts the excitation light to generate the wavelength-converted light. The wavelength conversion layer 14 is formed while filling the inside of the pattern of the metal layer 13.

The quantum dot is a nano-sized light emitting body which has a diameter of 10 nm or less and exhibits a quantum confinement effect. The quantum dot generates stronger light than a typical phosphor in a narrow wavelength. The emission of the quantum dot is generated when excited electrons move from a conduction band to a valence band. Even the same material exhibits different wavelengths according to the particle size. As the size of the quantum dot is smaller, light having a shorter wavelength is emitted. Thus, light having a desired wavelength range can be obtained by adjusting the size of the quantum dot.

The quantum dot emits light even at an arbitrary excitation wavelength. Thus, when several kinds of quantum dots exist, several color light can be observed at a time even though the quantum dot is excited at a single wavelength. Furthermore, since the quantum dot moves from the ground oscillation state of the conduction band to the ground oscillation state of the valence band, it is advantageous that the emission wavelength is almost the monochromatic light.

The quantum dot may be a semiconductor nanocrystal. Examples of the quantum dot may include Si nanocrystal, group II-VI compound semiconductor nanocrystal, group III-V compound semiconductor nanocrystal, or group IV-VI compound semiconductor nanocrystal. In the current embodiment, the quantum dots may be used solely or in mixture thereof.

The group II-VI compound semiconductor nanocrystal may include, but is not limited to, CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe.

Furthermore, the group III-V compound semiconductor nanocrystal may include, but is not limited to, GaN, GaP, GaAs, AlN, AlP, AlAs, InN, InP, InAs, GaNP, GaNAs, GaPAs, AlNP, AlNAs, AlPAs, InNP, InNAs, InPAs, GaAlP, GaAlNAs, GaAlPAs, GaInNP, GaInAs, GaInPAs, InAlNP, InAlNAs, or InAlPAs.

Moreover, the group IV-VI compound semiconductor nanocrystal may include, but is not limited to, SbTe.

As a method of synthesizing the nanocrystal as the quantum dot, the quantum dot is formed by a vapor deposition method, such as a metal organic chemical vapor deposition (MOCVD) or a molecular beam epitaxy (MBE), or a chemical wet method of growing a crystal by putting a precursor material into an organic solvent.

The phosphor may be selected from an oxide phosphor, a sulfide phosphor, and a nitride phosphor according to the conversion wavelength. For example, the phosphor may include a yellow emission phosphor based on β-SiAlON:Eu, Re, a silicate-based green emission phosphor such as (Ba,Sr,Ca,Mg)$_2$SiO$_4$:Eu,Re, or a sulfide-based green emission phosphor such as (Ba,Sr,Ca,Mg) (Ga,Al,In)$_2$(S,Se,Te)$_4$:Eu,Re, a nitride-based red emission phosphor such as (Sr,Ca,Ba,Mg) AlSiN$_x$:Eu,Re (1≦x≦5), or a sulfide-based red emission phosphor such as (Sr,Ca,Ba,Mg)(S,Se,Te):Eu,Re. Herein, Re may be any one of Nd, Pm, Sm, Tb, Dy, Ho, Er, Tm, Yb, F, Cl, Br, and I.

The wavelength conversion layer 14 may be used by dispersing the quantum dot in a dispersive medium. The dispersive medium may be a resin such as epoxy resin or silicon. The wavelength conversion layer 14 may be formed by dispersing the quantum dot or phosphor in the dispersive medium and coating the dispersive medium on the metal layer 13. The wavelength conversion performance of the wavelength conversion layer 14 may be selected by adjusting the concentration of the quantum dot or phosphor dispersed in the dispersive medium.

In the wavelength conversion plate 10, the quantum dot or phosphor included in the wavelength conversion layer 14 absorbs the incident light and emits the wavelength-converted light. Thus, in addition to the wavelength conversion function, the wavelength conversion plate 10 can amplify the emission of the wavelength-converted light due to the surface plasmon phenomenon generated in the metal layer 13 formed inside the nano pattern 12.

Therefore, the wavelength conversion plate 10 can be variously used when it is necessary to receive an excitation light from a light source, wavelength-convert the received excitation light and then amplify the wavelength-converted light. For example, the wavelength conversion plate 10 may be used as a reflection plate of a light guide panel in an LED package or backlight unit, but it is not limited thereto. Hereinafter, a light emitting device using the wavelength conversion plate 10 will be described in detail with reference to FIGS. 2 to 5.

Figure 2:
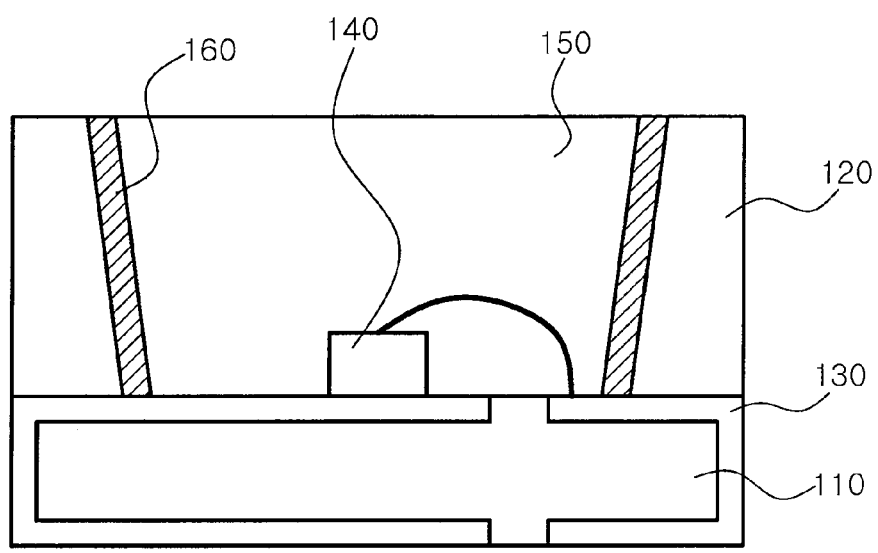
FIG. 2 illustrates a light emitting device including the wavelength conversion plate according to an embodiment of the present invention.

FIG. 2 illustrates a light emitting device including a wavelength conversion plate according to an embodiment of the present invention. Herein, duplicate description about the dielectric layer, the nano pattern, the metal layer, and the wavelength conversion layer in the light emitting device 100 of FIG. 2 will be omitted, except when necessary.

The light emitting device 100 according to the embodiment of the present invention includes a light emitting element 140, a groove part, a support part 110, and a wavelength conversion plate 160. The groove part has a bottom surface where the light emitting element 140 is mounted, and a side surface where a reflection part 120 is formed. The support part 110 supports the groove part and includes an electrode part 130 electrically connected to the light emitting element 140. The wavelength conversion plate 160 is disposed in at least one of the bottom surface and the side surface of the groove part. The wavelength conversion plate 160 includes a dielectric layer with nano pattern, a metal layer formed inside the nano pattern, and a wavelength conversion layer formed on the metal layer and including quantum dot or phosphor which wavelength-converts an excitation light to generate a wavelength-converted light. The electrode part 130 is formed with two sections which are electrically separated.

The light emitting element 140 may be one of a light emitting diode and a laser diode. A blue LED may be used as the light emitting element 140. The blue LED may be a GaN-based LED emitting a blue light of 420-480 nm. The electrode part 130 is formed on the support part 110 and is electrically connected to the light emitting element 140 through a wire.

An encapsulation part 150 is formed of an encapsulation material on the light emitting element 140 in order to encapsulate the light emitting element 140. The encapsulation part 150 is formed by filling the groove part with an encapsulation material, such as epoxy, silicon, acryl-based polymer, glass, carbonate-based polymer, or a mixture thereof.

The reflection part 120 formed in the side surface of the groove part reflects light generated from the light emitting element 140 toward the outside of the groove part. In FIG. 2, the wavelength conversion plate 160 is formed in the reflection part 120.

The wavelength conversion plate 160 includes the dielectric layer with the nano pattern, the metal layer formed on the dielectric layer, and the wavelength conversion layer formed on the metal layer and including the quantum dot or phosphor which wavelength-converts the light generated from the light emitting element 140 to generate the wavelength-converted light. As described above with reference to FIG. 1, the wavelength conversion layer may be used by dispersing the quantum dot or phosphor in the dispersive medium. Since the dispersive medium may be a resin such as epoxy resin or silicon, it may be an identical or similar material to the encapsulation material.

Since the wavelength conversion plate 160 wavelength-converts and amplifies the light from the light emitting element 140, the quantum dot or phosphor inside the wavelength conversion plate 160 may be selected considering color and intensity of light desired to be obtained from the light emitting device 100. For example, when the light emitting element 140 emits a blue light, the light emitting device 100 can emit a white color by selecting the quantum dot or phosphor inside the wavelength conversion plate 160 such that it emits a yellow color.

Figure 3:
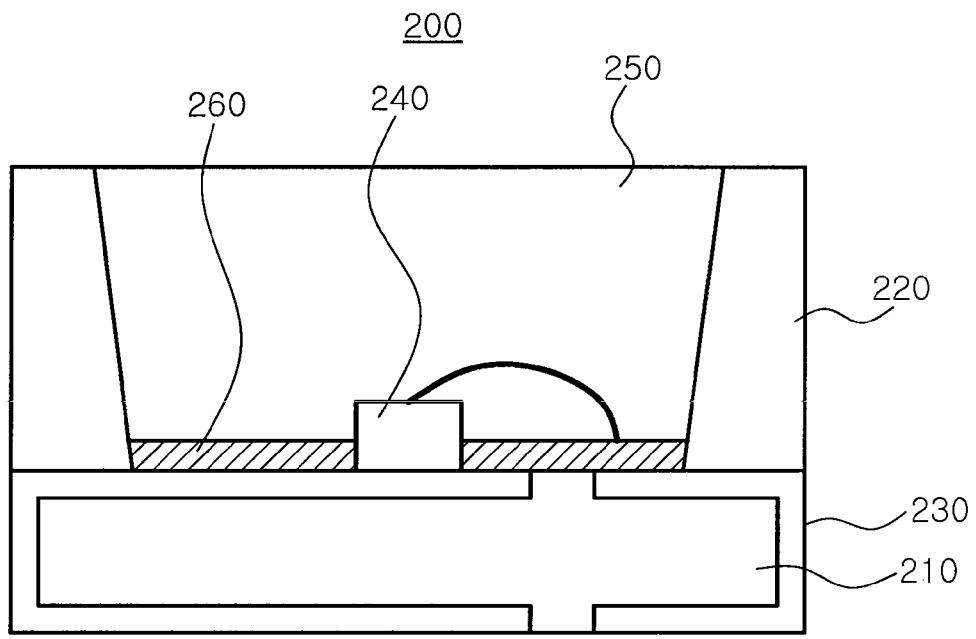
FIG. 3 illustrates a light emitting device including the wavelength conversion plate on the bottom surface of a groove part according to another embodiment of the present invention.

Although the wavelength conversion plate 160 shown in FIG. 2 is disposed at the reflection part 120 located on the side surface of the groove part, it can also be disposed on the bottom surface of the groove part. FIG. 3 illustrates a light emitting device according to another embodiment of the present invention, in which a wavelength conversion plate is disposed on a bottom surface of a groove part. Regarding a dielectric layer, a nano pattern, a metal layer, and a wavelength conversion layer in the light emitting device 200 of FIG. 3, the description of the same parts as described with reference to FIGS. 1 and 2 will be omitted, except when necessary. Also, regarding a support part 210, a reflection part 220, an electrode part 230, a light emitting element 240, an encapsulation part 250, and a wavelength conversion plate 260, the description of the same parts as described with reference to FIG. 2 will be omitted.

Unlike in FIG. 2, the wavelength conversion plate 260 is disposed on the bottom surface of the groove part where the light emitting element 240 is mounted. The wavelength conversion plate 260 is formed in a region other than the region where the light emitting element 240 is formed. The case where the wavelength conversion plate 260 is formed on the bottom surface of the groove part is related to the shape of the light emitting device 200. In order for the wavelength conversion plate 260 to effectively wavelength-convert and amplify the light from the light emitting element 240, the quantity of light reaching the wavelength conversion plate 260 should be large. However, if the width of the light emitting device 200 is wide, the case where the excitation light reaches the bottom surface may be much more than the case where the excitation light reaches the reflection part 220. Therefore, in such a case, the wavelength conversion plate 260 is formed on the bottom surface of the groove part.

Figure 4:
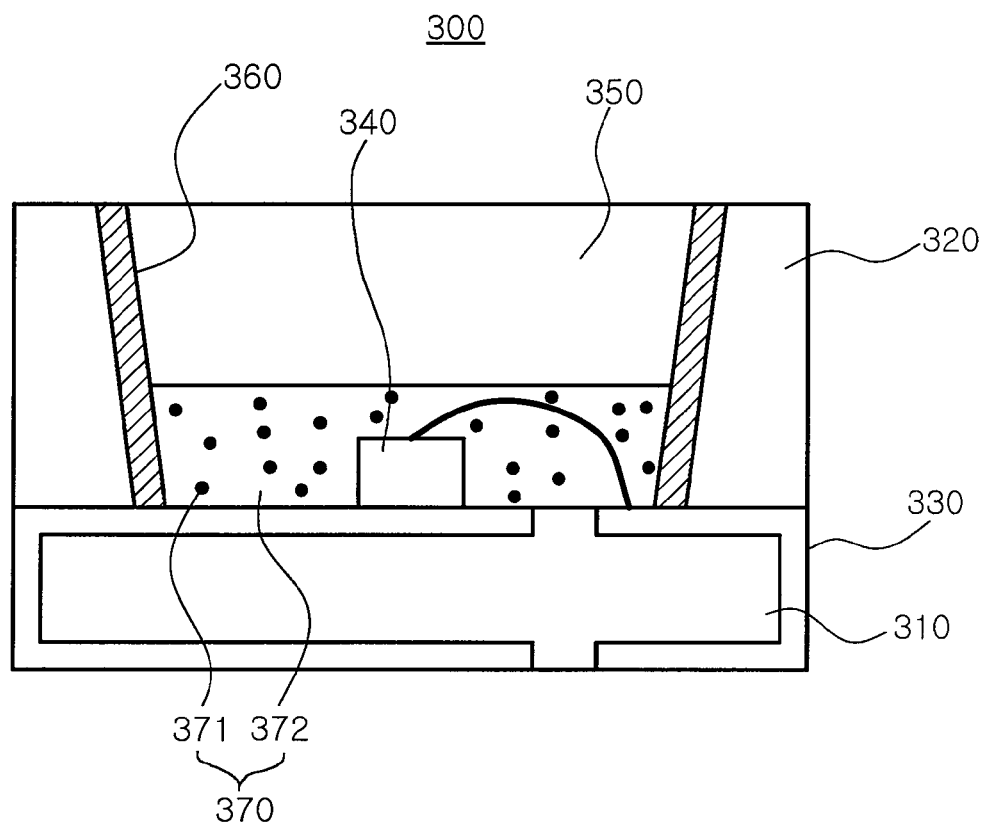
FIG. 4 illustrates a light emitting device further including a wavelength conversion unit according to another embodiment of the present invention.

According to another embodiment of the present invention, in addition to the wavelength conversion plate formed in at least one of the side surface and the bottom surface of the groove part, a light emitting device further includes a wavelength conversion unit which wavelength-converts light from the light emitting element. FIG. 4 illustrates the light emitting device which further includes the wave conversion unit according to the embodiment of the present invention. Regarding a dielectric layer, a nano pattern, a metal layer, and a wavelength conversion layer in the light emitting device 300 of FIG. 4, the description of the same parts as described with reference to FIGS. 1 to 3 will be omitted, except when necessary. Also, regarding a support part 310, a reflection part 320, an electrode part 330, a light emitting element 340, an encapsulation part 350, and a wavelength conversion plate 360, the description of the same parts as described with reference to FIGS. 2 and 3 will be omitted.

In the current embodiment, the wavelength conversion unit 370 further included in the light emitting device 300 includes a wavelength conversion body 371 and a dispersive medium 372. The wavelength conversion body 371 may be a typical quantum dot or phosphor. The dispersive medium 372 may be a medium which properly disperses polymer resin and the wavelength conversion body 371. The dispersive medium 372 may be an identical or similar material to an encapsulation material of the encapsulation part 350.

After mounting the light emitting element 340, the wavelength conversion unit 370 may be formed on the light emitting element 340 before the groove part is filled with the encapsulation material 350. The wavelength conversion unit 370 can include an appropriate quantum dot or phosphor according to the wavelength of light desired to be obtained from the light emitting device 300, the color of the light emitted from the light emitting device 300 can be controlled together with the quantum dot or phosphor included in the wavelength conversion plate 360. Although the wavelength conversion unit 370 shown in FIG. 4 is formed in a layer type, it can also be formed to cover the surface of the light emitting device 340. Also, the wavelength conversion unit 370 may be disposed in any shape only if the light incident from the light emitting element 340 can be wavelength-converted at the wavelength conversion unit 370.

At this point, the light emitting device 300 can emit a white light, when the light emitting element 340 emits a blue light, the quantum dot or phosphor of the wavelength conversion unit 370 emits a red light, and the quantum dot or phosphor of the wavelength conversion plate 360 emits a green light. Furthermore, the light emitting element 340 can be made to emit a blue light, and the quantum dot or phosphor of the wavelength conversion unit 370 can be made to emit a yellow light. In this case, the quantum dot of the wavelength conversion plate 360 can be selected to emit a blue light or a yellow light. The color rendering of the light emitted from the light emitting device 300 can be controlled by making the quantum dot of the wavelength conversion plate 360 emit the light having the lower intensity of the blue light and the yellow light.

Figure 5:
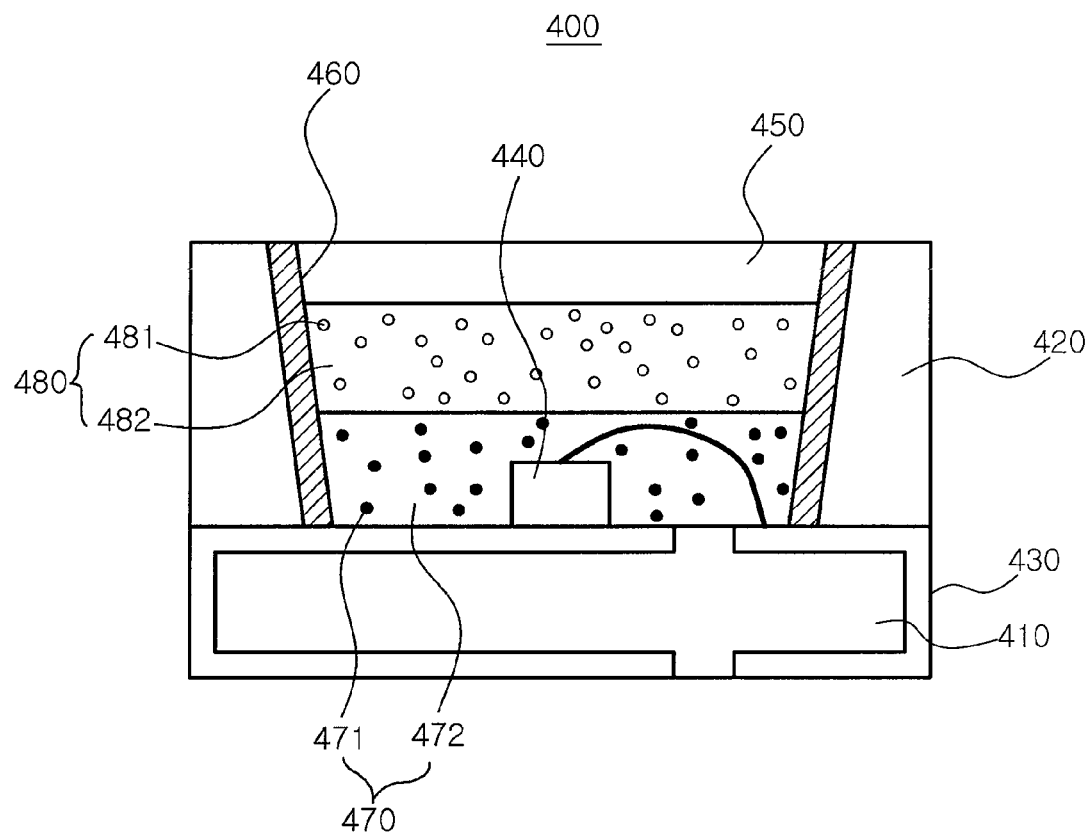
FIG. 5 illustrates a light emitting device further including a plurality of wavelength conversion units according to another embodiment of the present invention.

According to another embodiment of the present invention, a light emitting device may further include a plurality of wavelength conversion units. FIG. 5 illustrates the light emitting device which further includes the plurality of wave conversion units according to the embodiment of the present invention. Regarding a dielectric layer, a nano pattern, a metal layer, and a wavelength conversion layer in the light emitting device 400 of FIG. 5, the description of the same parts as described with reference to FIGS. 1 to 4 will be omitted, except when necessary. Also, regarding a support part 410, a reflection part 420, an electrode part 430, a light emitting element 440, an encapsulation part 450, and a wavelength conversion plate 460, the description of the same parts as described with reference to FIGS. 2 and 4 will be omitted.

In the current embodiment, the wavelength conversion units further included in the light emitting device 400 include a first wavelength conversion unit 470 and a second wavelength conversion unit 480. In FIG. 5, a wavelength conversion unit nearer to the light emitting element 440 is referred to as the first wavelength conversion unit 470, and another is referred to as the second wavelength conversion unit 480. The first wavelength conversion unit 470 includes a first wavelength conversion body 471 and a first dispersive medium 472, and the second wavelength conversion unit 480 includes a second wavelength conversion body 481 and a second dispersive medium 482. The first and second wavelength conversion bodies 471 and 481 may be typical quantum dots or phosphors. The first and second dispersive media 472 and 482 may be media which properly disperse polymer resin and the first and second wavelength conversion bodies 471 and 481. The first and second dispersive media 472 and 482 may be an identical or similar material to an encapsulation material of the encapsulation part 450.

When the wavelength conversion unit is implemented with a plurality of layers, at least two wavelength conversion units may include quantum dots or phosphors which can convert the light emitted from the light emitting element into light having different wavelengths. Therefore, the light emitting element 440 emits a blue light, any one of the wavelength conversion units emits a red light, and the second wavelength conversion unit 480 different from the first wavelength conversion unit emits a green light. In this way, the light emitting device can emit a white light. Furthermore, the wavelength conversion plate 460 can select quantum dots to emit light by appropriately selecting the wavelength of the light required to be amplified among the blue light, the red light, and the green light.

Alternatively, the light emitting device can emit a white light, when the light emitting element 440 emits an infrared ray, and the wavelength conversion plate 460, the first wavelength conversion unit 470 and the second wavelength conversion unit 480 emit a blue light, a green light and a red light, respectively.

The light emitting devices are shown in a package type in FIGS. 2 to 5, but they are not limited thereto. For example, the light emitting devices may be lamp-type light emitting devices.

The wavelength conversion plates according to the embodiments of the present invention can use the surface plasmon phenomenon by forming the metal layer on the dielectric layer with the nano pattern. Therefore, the wavelength-converted light generated by the wavelength conversion of the excitation light at the quantum dot, or the light emitted from the light emitting source can be amplified by the surface plasmon phenomenon.

Furthermore, if the wavelength conversion plate capable of amplifying the light by using the surface plasmon phenomenon is used on the side surface of the light emitting package, the luminous efficiency of the light emitting package can be increased. In addition, if the wavelength conversion plate is used as the reflection plate or wavelength conversion plate of the light emitting source, the light of the light emitting source can be amplified. Thus, the light emitting device having excellent efficiency can be manufactured.

While the present invention has been shown and described in connection with the exemplary embodiments, it will be apparent to those skilled in the art that modifications and variations can be made without departing from the spirit and scope of the invention as defined by the appended claims.

What is claimed is:
1. A light emitting device comprising:
a light emitting element;
a groove part having a bottom surface where the light emitting element is mounted, and a side surface where a reflection part is formed;
a support part supporting the groove part and comprising an electrode part electrically connected to the light emitting element; and
a wavelength conversion plate disposed in at least one of the bottom surface and the side surface of the groove part, the wavelength conversion plate comprising:
a dielectric layer with a nano pattern, wherein the nano pattern comprises a plurality of nano scale grooves;
a metal layer formed on an inside wall of the nano scale grooves of the nano pattern; and
a wavelength conversion layer formed on the metal layer and comprising quantum dot or phosphor which wavelength-converts an excitation light to generate a wavelength-converted light.

2. The light emitting device of claim 1, further comprising a wavelength conversion unit disposed on the light emitting element and comprising quantum dot or phosphor which wavelength-converts light from the light emitting element.

3. The light emitting device of claim 2, wherein the wavelength conversion unit is implemented with a plurality of layers.

4. The light emitting device of claim 3, wherein at least two wavelength conversion units among the plurality of wavelength conversion units comprise quantum dots or phosphors which convert the light emitted from the light emitting element into light having different wavelengths.

5. The light emitting device of claim 4, wherein the light emitting element emits an infrared light;
the wavelength conversion plate emits a blue light;
a first wavelength conversion unit among the plurality of wavelength conversion units emits a red light; and
a second wavelength conversion unit different from the first wavelength conversion unit among the plurality of wavelength conversion units emits a green light.

6. The light emitting device of claim 2, wherein the wavelength conversion unit is formed inside the groove part where the light emitting element is mounted.

* * * * *